United States Patent [19]

Berger

[11] 4,316,258

[45] Feb. 16, 1982

[54] DIGITALLY PROGRAMMABLE FILTER USING ELECTRICAL CHARGE TRANSFER

[75] Inventor: Jean L. Berger, Paris, France

[73] Assignee: Thomson-CSF, Paris, France

[21] Appl. No.: 93,817

[22] Filed: Nov. 13, 1979

[30] Foreign Application Priority Data

Nov. 17, 1978 [FR] France ................................. 78 32538

[51] Int. Cl.³ .................. G06G 7/16; H03K 5/159
[52] U.S. Cl. .................. 364/602; 307/221 D;
333/165; 357/24; 364/825; 364/862
[58] Field of Search .............. 364/600, 602, 604, 607,
364/608, 825, 862, 819; 328/167; 333/165;
307/221 D; 357/24

[56] References Cited

U.S. PATENT DOCUMENTS

| | | | |
|---|---|---|---|
| 3,987,293 | 10/1976 | Crooke et al. .................. | 364/825 |
| 4,063,200 | 12/1977 | Mattern .......................... | 364/862 X |
| 4,100,513 | 7/1978 | Weckler .......................... | 364/825 X |
| 4,120,035 | 10/1978 | Cases et al. .................... | 364/825 X |
| 4,218,752 | 8/1980 | Hewes et al. ................... | 333/165 X |

OTHER PUBLICATIONS

Knauer et al.—"Digitally-Controlled Adaptive CCD Filter"—Siemens-Forsch—V. Entwickl—Ber. Bd. 8 (1979) IVR. 3—Mar. 8, 1979.

Primary Examiner—Joseph F. Ruggiero
Attorney, Agent, or Firm—Roland Plottel

[57] ABSTRACT

The filter has p stages, p being the number of bits on which are expressed the digital filtering coefficients. Each of the stages has a charge transfer shift register, called the signal register, receiving the analog signal E(t) to be filtered and a charge transfer shift register, called the coefficient register, receiving the M bits of the same weight of the M filtering coefficients. The filter also has an operator which multiplies the signal E(t) by each of the M filtering coefficients and then summates these various products to supply the output signal S(t) of the filter.

15 Claims, 19 Drawing Figures

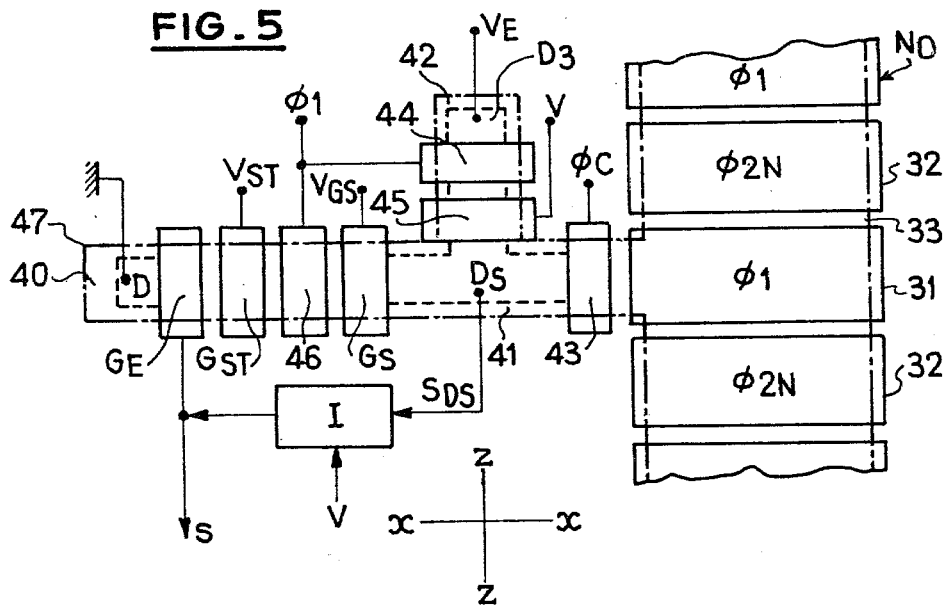
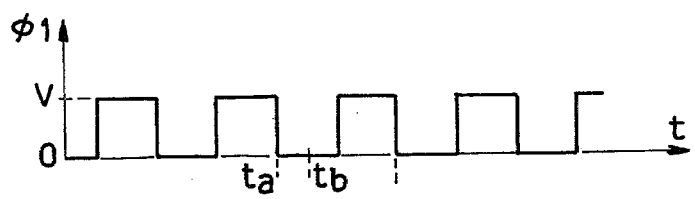
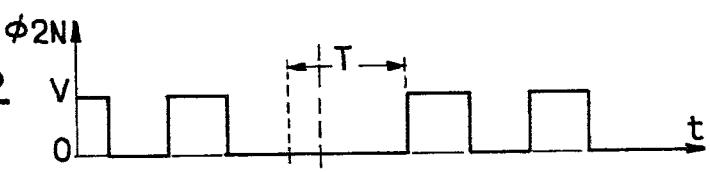
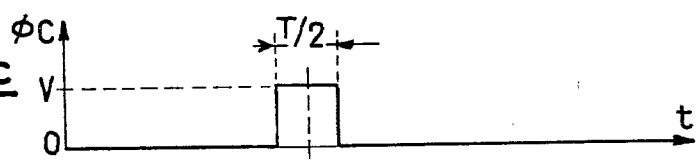

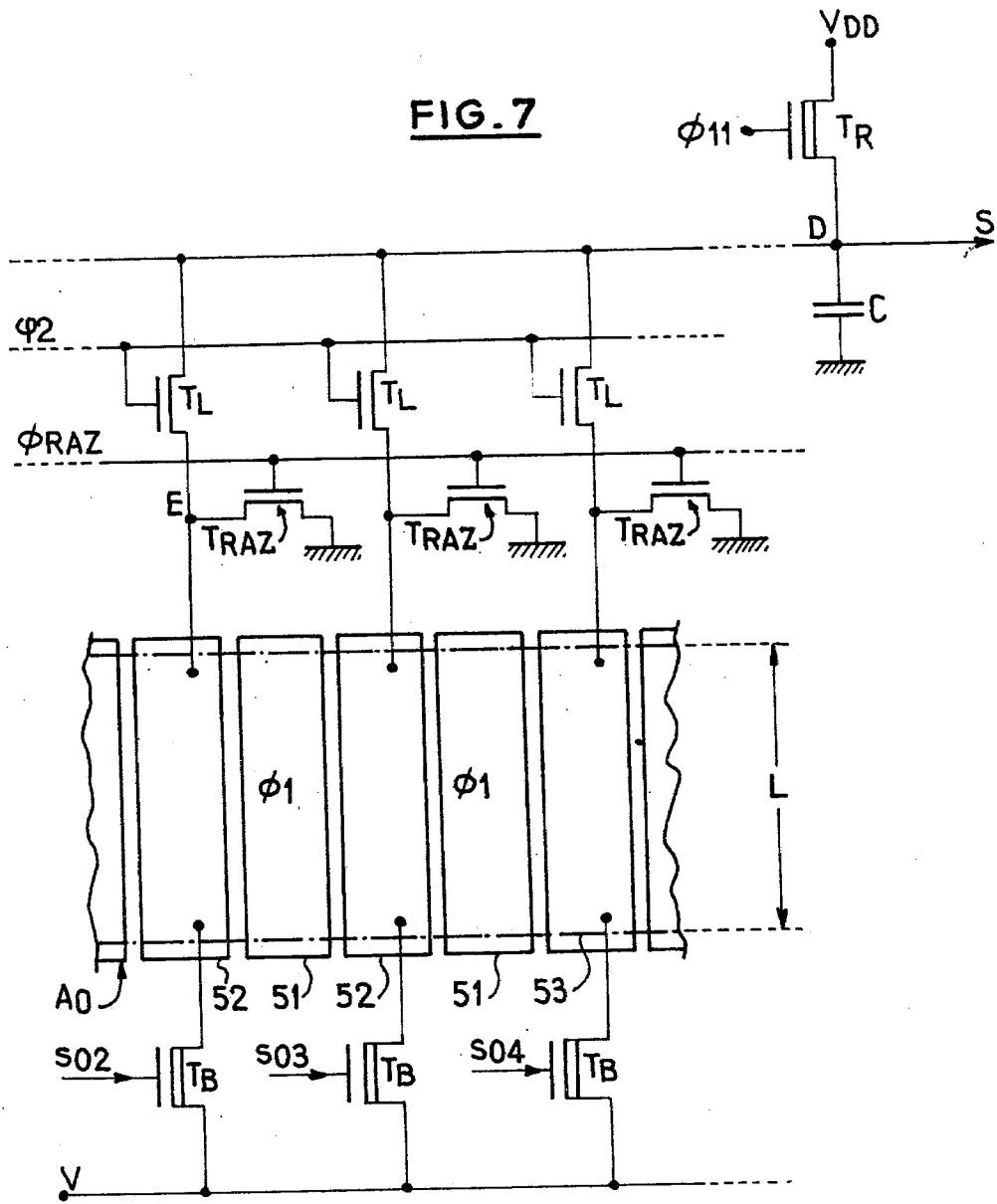

DIGITALLY PROGRAMMABLE FILTER USING ELECTRICAL CHARGE TRANSFER

BACKGROUND OF THE INVENTION

The present invention relates to filters for electrical signals, called transversal filters, which use the transfer of charges into a semiconductor. It more particularly relates to a filter which is programmable by digital data.

A charge transfer transversal filter usually comprises a semiconductor substrate covered by an insulant on which are placed electrodes. By the periodic application of given potentials the latter ensure the transfer of packets of electrical charges representing the signal to be processed. These electrodes are arranged parallel to one another and transversely with respect to the charge transfer direction. Certain of these electrodes are transversely split into two unequal parts and the quantities of charges arriving beneath said electrodes are read differentially, i.e., for example the upper part of said split electrodes is given the plus sign and the lower part the minus sign. This leads to a weighting of the signal by coefficients equal respectively to the ratio of the lengths of the two parts of the split electrodes, the differential signal constituting the output signal of the filter.

The advantages of this type of filter are mainly due to the characteristics of the charge transfer devices, i.e. the constructional simplicity and low consumption.

An important disadvantage is that the filtering coefficients are finally fixed during the manufacture of the filter.

BRIEF SUMMARY OF THE INVENTION

The present invention relates to a filter using the charge transfer method in which the value of the filtering coefficients is not defined beforehand and is instead supplied by external digital data.

Such a filter has the advantage of being applicable to various signal processing fields, including the rapid testing of new filtering processes, digital—analog conversion, radar, etc.

To this end the invention has a system of p filtering stages, p being the number of bits on which each of the M filtering coefficients are expressed, each of the p stages comprising a charge transfer shift register, called the signal register, which comprises M cells and receives the analog input signal E(t) of the filter, a charge transfer shift register, called the coefficient register, which comprises M cells and receives a given weight bit of each of the M filtering coefficients. The filter also has an operator which with respect to each stage performs the digital—analog multiplication of the data contained in the two registers, i.e. of signal E(t) by each of the M filtering coefficients, then the summation of these different elementary products to supply the output signal of the filter.

BRIEF DESCRIPTION OF THE DRAWINGS

The invention will be described in greater detail hereinafter relative to embodiments and with reference to the attached drawings, wherein show:

FIG. 3a a charge transfer memory element used in the filter according to the invention, FIG. 3b being the diagram of part of FIG. 3a.

FIG. 4 signal diagrams (4a to 4e) relating to FIG. 3a.

FIG. 5 diagrammatically part of one of the digital registers used in the filter according to the invention.

FIG. 6 signal diagrams (6a to 6c) relating to FIG. 5.

FIG. 7 a detail of part of a filter stage according to the invention.

DETAILED DESCRIPTION OF THE PREFERRED EMBODIMENTS

Figure 1:
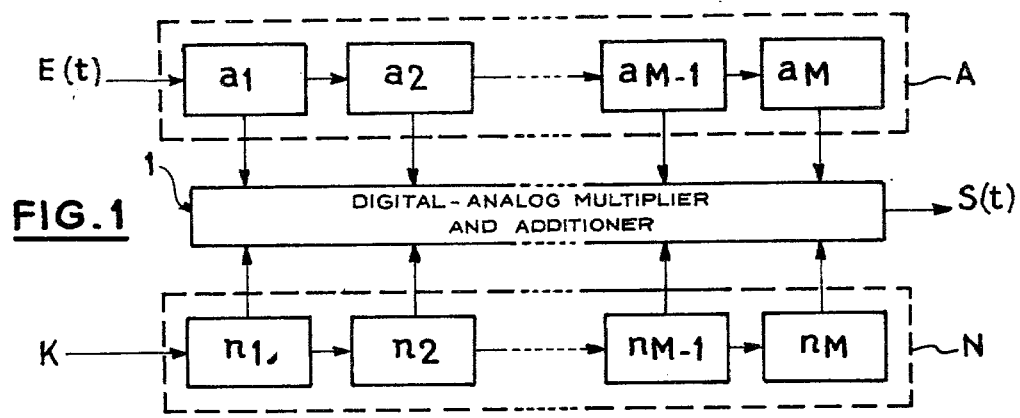
FIG. 1 the general diagram of a charge transfer filter.

In the various drawings the same reference numerals and letter relate to the same elements.

FIG. 1 is the basic circuit diagram of a digitally programmable charge transfer filter, which essentially comprises the followng three elements:

a shift register A, called the signal register, which receives the analog input signal E(t) to be filtered;

a shift register N, called the coefficient register, which receives in successive manner at input K the M filtering coefficients expressed in digital form;

an operator 1 for the digital—analog multiplication of the data contained in registers A and N and the summation of the results obtained.

Register A has a series of M transfer stages, called cells $a_1 \ldots a_M$, each introducing the same delay T. Register A is realised by means of charge transfer devices, the delay period T being given by the period of the potentials applied to the electrodes ensuring the transfer of the charges.

Register N also has M cells $n_1 \ldots n_M$ for receiving M filtering coefficients and is also realised by means of charge transfer devices.

Operator 1 performs the multiplication of signal E(t) by each of the M coefficients contained in register N and the summation of the results obtained, which constitutes the filtered signal S(t) forming the output signal of the device.

Figure 2:
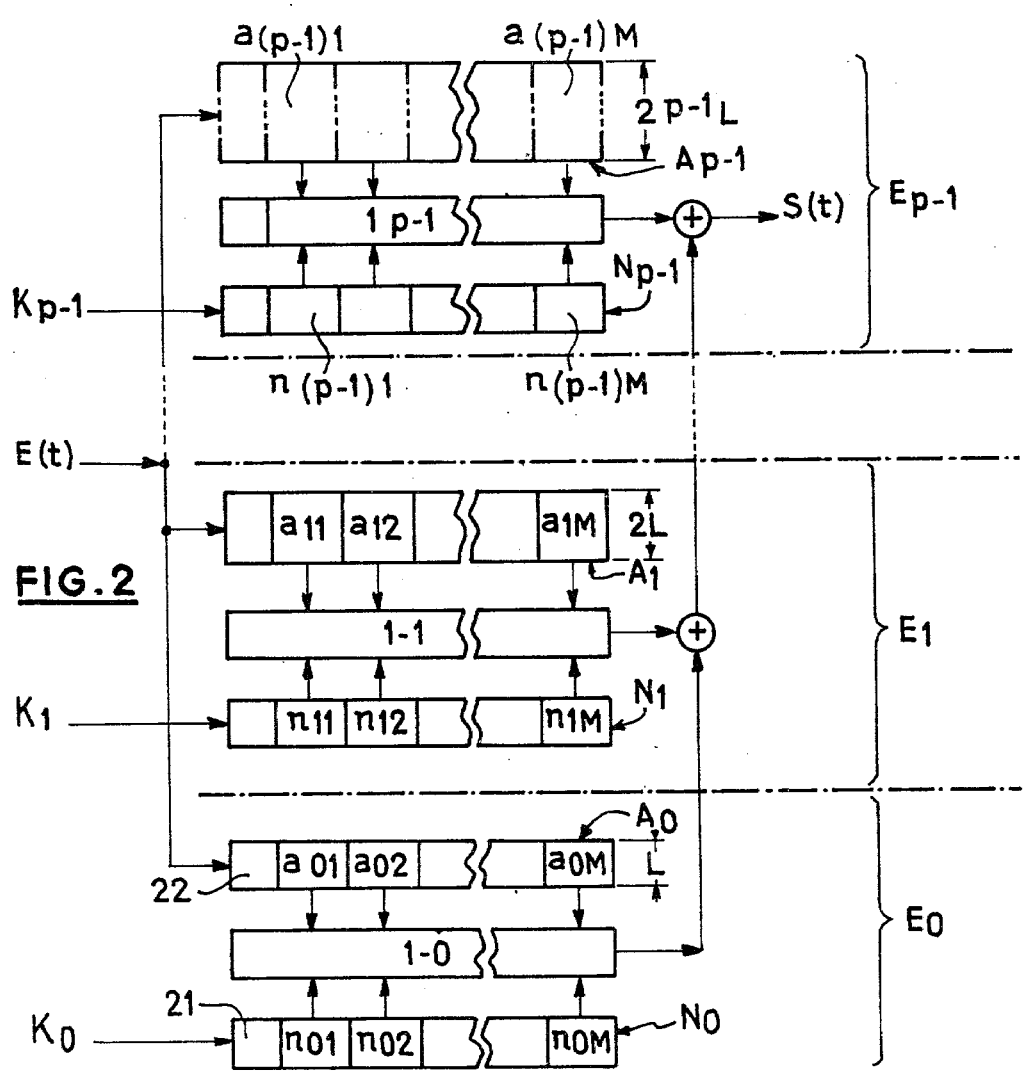
FIG. 2 the diagram of the filter according to the invention.

FIG. 2 shows the general diagram of the device according to the invention. In this device the filtering coefficients are expressed in digital form on p bits and the diagram of FIG. 1 is then broken down into p stages, called $E_0, E_1 \ldots E_{p-1}$.

More specifically stage $E_0$ is formed as follows:

a charge transfer shift register $N_0$, or coefficient register, which receives the smallest weight bit ($K_0$) from each of the M coefficients and which has an injection stage 21 receiving signal $K_0$ and transforming it into packets of charges and M cells $n_{01} \ldots n_{0M}$;

a second charge transfer shift register $A_0$, or signal register, of width L and which also has an injection stage (22) receiving the analog signal E(t) to be filtered and transforming it into packets of charges, and M cells $a_{01} \ldots a_{0M}$;

a digital—analog multiplication and summation element 1-0 forming the product of E(t) from each of the bits contained in register $N_0$.

In the same way the second stage ($E_1$) of the filter has a coefficient register $N_1$ receiving the weight bit 1 ($K_1$) of each of the M coefficients, a signal register $A_1$ of double width (2L) of $A_0$ receiving the signal E(t) and a digital; analog multiplication and summation element 1-1 supplying the products of E(t) for each of the bits contained in register $N_1$.

The other stages of the filter are realised in the same way up to the final stage ($E_{p-1}$) which has a coefficient register $N_{p-1}$ receiving the highest weight bit ($K_{p-1}$) of each of the M coefficients, a signal register $A_{p-1}$ of width equal to $L(2^{p-1})$ receiving the signal E(t) and a digital—analog multiplication and summation element 1-p-1 supplying the products of E(t) for each of the bits contained in register $N_{p-1}$.

It is known that the quantity of charges injected into a charge transfer register is a function of the register width. As the signal registers $A_0 \ldots A_{p-1}$ have widths increasing from L to $2^{p-1}L$ the quantities of injected charges vary by a power of two, thus bringing about the weighting of the coefficient bits. The output signal S(t) of the device is then obtained by summating the various elementary products.

The various shift registers (A) receiving the analog input signal E(t) are constituted in per se known manner using the charge transfer method C.C.D. (Charge Coupled Devices) and will now be described in greater detail here.

However, the shift registers (N) receiving the digital coefficients (K) are not of a random type. They must make it possible to provide the coefficient bits in front of each cell of the analog registers (A) and to maintain them in this position throughout the operation of the device in such a way that the value of the filtering coefficients is not modified. For this purpose a conventional charge transfer shift register is used and to each of its outputs are added a memory element able to store the value of the coefficient bit. It is preferable for the memory elements to use the charge transfer method and they can advantageously be of the type described in U.S. Application Ser. No. 75,845, now U.S. Pat. No. 4,264,964 of THOMSON-CSF, whereby one of the embodiments of said construction is refered to in FIG. 3a of the present description.

Figure 3A:
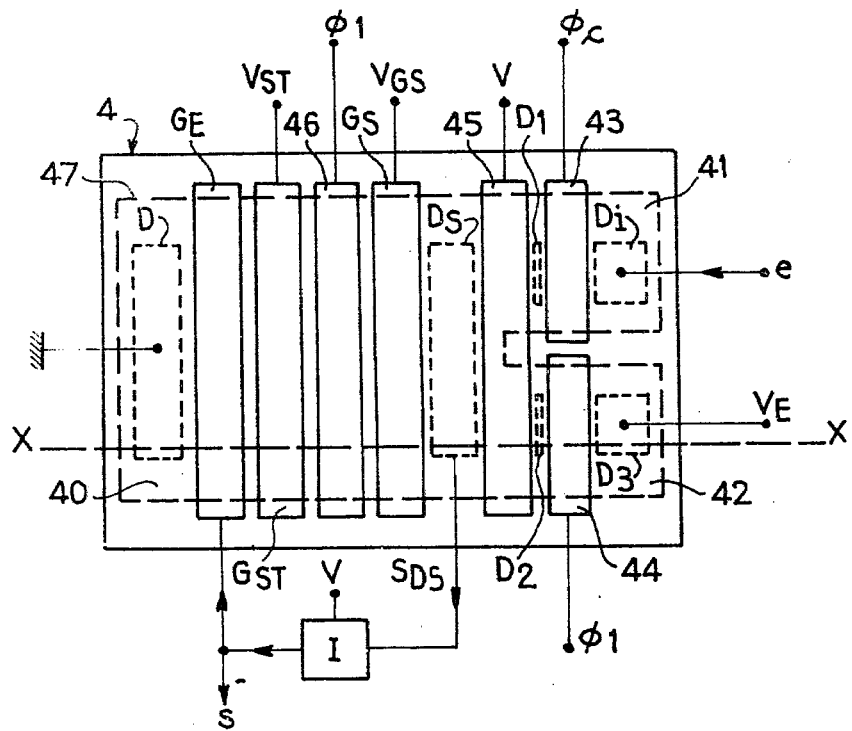

The memory element of FIG. 3a is viewed from above and in conventional manner for charge transfer devices comprises a semiconductor substrate 4 (e.g. silicon) covered by an insulating layer (e.g. silicon oxide) and electrodes placed on the insulating layer. Five of these electrodes or gates, i.e. successively $G_E$, $G_{ST}$, 46, $G_S$ and 45 are arranged parallel to one another and perpendicular to the charge transfer direction XX into the semiconductor and extending over the entire width of the device. Two half-electrodes 43 and 45 are placed on the side of electrode 45. Diodes, for example by diffusion of impurities creating zones of type N are provided in the semiconductor substrate 1, for example of the P type. The first diode (D) is placed in front of gate $G_E$ and connected to the reference potential of the device (earth), the second diode ($D_S$) is placed between electrodes $G_S$ and 45, the third diode ($D_1$) between electrodes 45 and 43, the fourth diode ($D_i$) behind electrode 43, and receives the input signal of the device, the fifth diode ($D_2$) between electrodes 45 and 44 and finally the sixth diode ($D_3$) after electrode 44. Using any known method an insulating barrier 47 is provided in substrate 1 and this has the function of defining a charge transfer channel 40 between diode D and electrode 45 and two parallel half-channels 41 and 42. The two latter channels result from the separation into two parts of channel 40 beneath electrode 45, channel 41 corresponding to diodes $D_1$, $D_i$ and to electrode 43 and channel 42 to diodes $D_2$, $D_3$ and electrode 44. It should be noted that, as described and known from the above-mentioned patent application, means (not described here) are provided in the device in order to make the transfer of the charges unidirectional. The device also has an inverting and regenerating element I connected between diode $D_S$ and grid $G_E$.

Figure 3B:
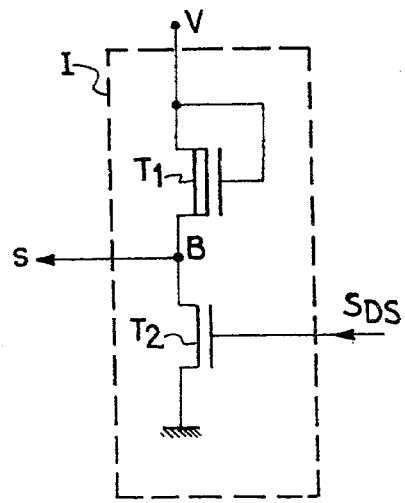
Figure 4A:
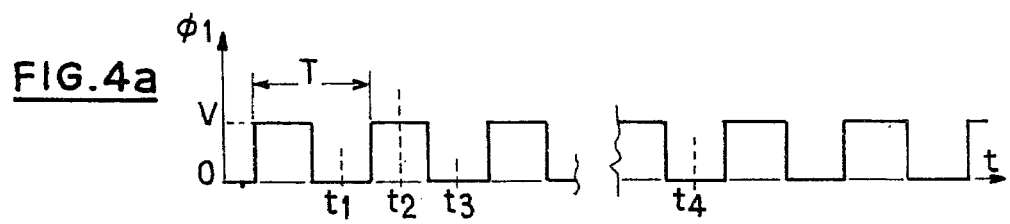
Figure 4B:
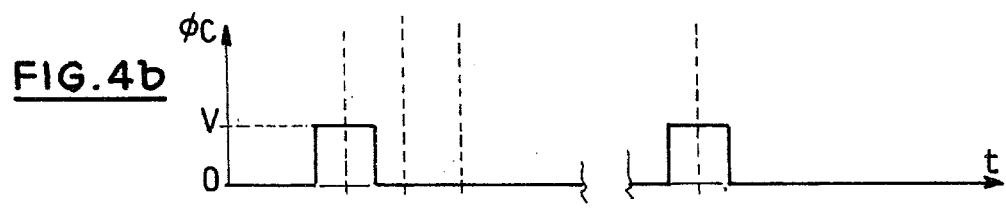
Figure 4C:
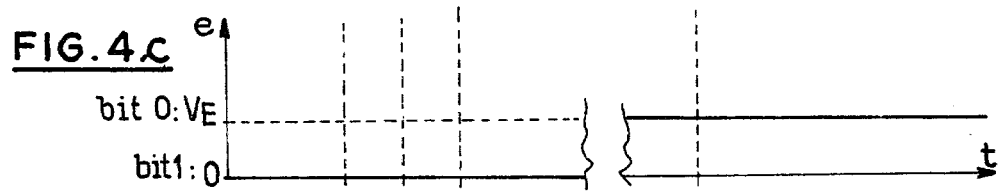
Figure 4D:
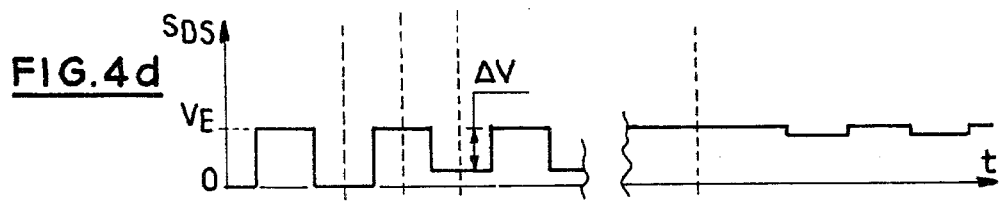
Figure 4E:
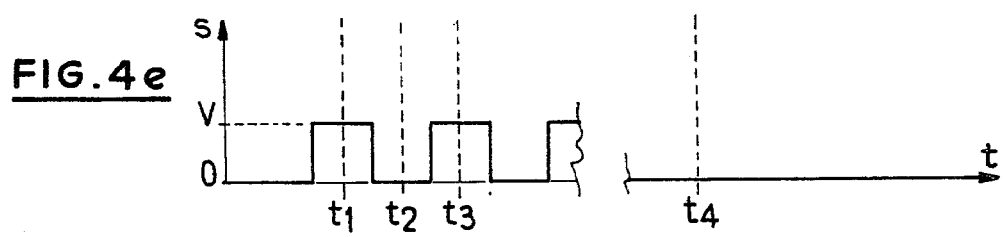
Figure 8A:
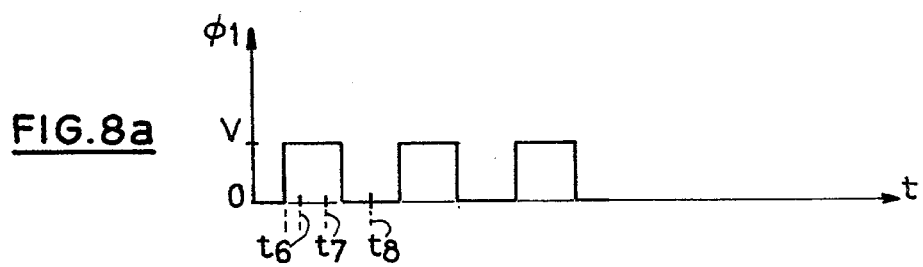
FIG. 8 signal diagrams (8a to 8d) relating to FIG. 7.
Figure 8B:
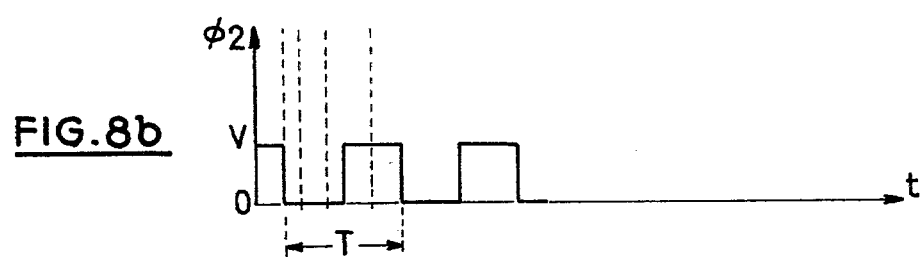
Figure 8C:
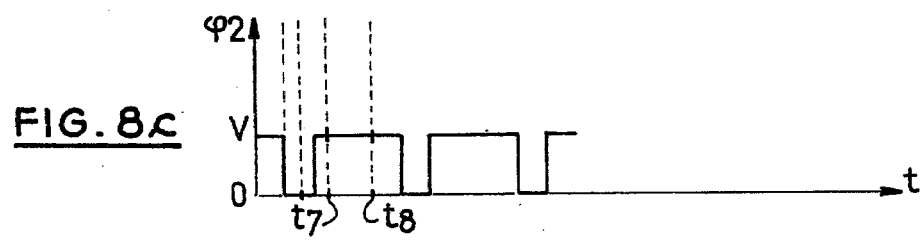
Figure 8D:
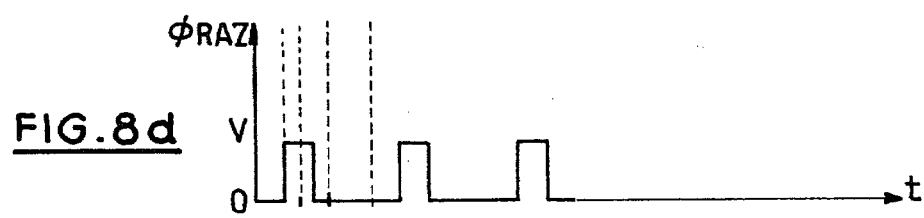

An embodiment of element I is given in FIG. 3b. It comprises two MOS-type transistors $T_1$ and $T_2$ connected in series between potential V and earth. It should be noted that transistor $T_1$ is of the depletion type and transistor $T_2$ of the enhancement type. The gate of $T_1$ is connected to potential V, whilst the gate of $T_2$ receives a signal $S_{DS}$ from diode $D_S$. There is a signal s at the common point B of these two transistors.

FIG. 4 shows as a function of time signal diagrams (4a to 4e) applicable to the device of FIG. 3a or supplied by the latter.

Diagram 4a shows a potential $\phi_1$, called the transfer potential, which is essentially of square wave form and of period T and whose amplitude preferably varies between 0 and V.

Diagram 4b shows a potential $\phi_C$, called sampling potential, which only differs from zero when it is desired to store the input signal e for a period T/2, when $\phi_1$ is at the low or zero level with an amplitude preferably equal to V.

Diagram 4c shows an example of the input signal e applied to the device.

Diagram 4d shows the signal $S_{DS}$ supplied by diode $D_S$ and supplying the inverter I.

Diagram 4e shows the signal s supplied by inverter I, which on the one hand constitutes the output signal of the memory element and on the other is applied to gate $G_E$.

Potentials V, $V_{ST}$, $V_{GS}$ and $V_E$ are continuous potentials respectively applied to gates $G_{ST}$, and $G_S$ and diode $D_3$. As an example potential V can be equal to 12 volts, $V_E$ is slightly below V and $V_{ST}$ and $V_{GS}$ are significantly lower, e.g. approximately 5 volts.

The memory element of FIG. 3a functions in the following way—the bit to be stored is applied to the input e and to diode $D_S$ whilst signal $\phi_C$ is in the upper position ($\phi_C = V$).

If the input bit has the value "one", represented by zero volt (time $t_1$ in FIG. 4) the potential $S_{DS}$ of diode $D_S$ assumes the value zero volt and the output signal s of inverter I is equal to V volts. There is then an injection of charges beneath the gates $G_E$ and $G_{ST}$ and this packet of charges is then transferred beneath electrode 46 (time $t_2$). During this time the potential $S_{DS}$ of diode $D_S$ is restored to the value $V_E$ by channel 42, which gives s=0 volt. At the following time ($t_3$) the packet of charges previously beneath electrode 46 is transferred to diode $D_S$ and its potential is decreased by a value $\Delta V$. If the threshold of inverter I is chosen correctly with respect to the value of $\Delta V$ signal s returns to the value zero volt. Thus, in the case where e=zero volt ("one" bit) the output signal s is a square wave signal phase-displaced by T/2 relative to $\phi_1$.

If the input bit has the value "zero", represented by $V_E$ volts, the potential $S_{DS}$ of diode $D_S$ assumes the value $V_E$ (time $t_4$) and the signal s the value zero, preventing any injection of charges. As no charge reduces the potential $S_{DS}$ of diode $D_S$, the latter remains at value $V_E$ and consequently the output signal s remains at the zero value.

A memory element such as that described hereinbefore is used at each of the parallel outputs of the shift registers N, as illustrated in FIG. 5.

FIG. 5 shows in exemplified manner part of the shift register $N_0$, conventionally constituted by a semiconductor substrate covered with an insulant on which are deposited identical parallel electrodes to which are applied given periodic potentials, e.g. $\phi_1$ for the uneven electrodes 31 and $\phi_{2N}$ for the even electrodes 32. A pair of electrodes 31, 32 defines a cell (n) of register $N_O$. In order to simplify the diagram register $N_0$ is only represented by its electrodes within which is noted the potential applied.

The electrical charges are transferred from one electrode to the other in a direction ZZ normal to the electrodes 31 and 32 in a channel defined by an insulating barrier 33.

Insulating barrier 33 is interrupted at each cell, i.e. for example level with each electrode 31 for the connection of a memory element. Connection is made by channel 41, which is in the extension of channel 40, channel 42 being arranged perpendicular thereto.

The memory element represented is for example that described in FIG. 3a. It can obviously be replaced by any one of the variants described in the above-mentioned patent application.

The memory element is therefore identical to that of FIG. 3a, except for the following three differences:

the elimination of diode $D_I$ of channel 41 used for the injection of input signal e, because the latter is now constituted by a of charges beneath electrode 31;

the orientation of the channel 42 which becomes normal to the axis XX for dimensional reasons, which slightly modifies the shape of diode $D_S$, which is now in T form in order to still connect the three channels 40, 41 and 42;

electrode 45 connected to potential V, which now only extends over channel 42, it only being really necessary on the latter channel because its function is to form a screen between diode $D_S$ and potential $\phi_1$ applied to electrode 44 of channel 42.

The operation of the device will be explained by means of FIG. 6, which shows signals $\phi_1$, $\phi_{2N}$ and $\phi_C$ which are applied thereto (respectively diagrams 6a, 6b and 6c). Signal $\phi_1$ is identical to that show in diagram 4a. Signal $\phi_{2N}$ applied to electrodes 32 of register $N_0$ is preferably identical to signal $\phi_1$, but is in phase opposition with the latter up to a time $t_a$.

Up to a time $t_a$ the digital data are injected in series into register $N_0$ and the signals $\phi_1$ and $\phi_{2N}$ ensure their transfer until the data are disposed over the complete register (at time $t_a$). After time $t_a$, which occurs when the potential $\phi_{2N}$ normally rises to the high level (V), the latter remains at the low level for a complete period (T). At this time $t_a$ signal $\phi_C$ illustrated in diagram 6c passes to the high level for a period close to T/2.

At a following time $t_b$ potential $\phi_1$ and $\phi_{2N}$ are at the lower level, whilst $\phi_C$ is at the high level. Two cases are then possible. If the charges are present beneath electrode 31 of register $N_0$, representing for example a binary information equal to one, these charges are all transferred by the action of $\phi_C$ and $\phi_{2N}$ to electrode $D_S$, thus bringing the potential of $D_S$ to zero volt and consequently, via inverter I, bringing about the injection of a packet of charges into the memory element. The data are thus stored and available at output s in the form illustrated in diagram 4e. If there is no group of charges beneath electrode 31 of register $N_0$, said absence representing for example binary data equal to zero, diode $D_S$ remains at level $V_E$ and signal s supplied by inverter I is then zero and there is no injection of charges into the memory element. The low level is then retained by the memory element and is available at output s.

In accordance with FIG. 2 the output signal s of the memory element is directed to the digital—analog multiplication and summation element of the stage in question ($E_0$ in the example of FIG. 5).

FIG. 7 shows in exemplified manner part of the signal register $A_0$, the corresponding part of the digital—analog multiplication and summation element of the stage $E_0$, and the signal inputs ($S_o$) from the corresponding coefficient register ($N_0$).

The signal register $A_0$ conventionally comprises a semiconductor substrate covered with an insulant on which are placed identical, parallel electrodes, to which are applied given periodic potentials.

As is known and in order to make the charge transfer unidirectional, the register has a first series of electrodes 51 and 52 in the drawing placed over a given insulating thickness and a not shown second series of electrodes (not shown), placed on an increased insulant thickness between electrodes 51 and 52. The uneven electrodes (51) and the electrodes of the second series which immediately precede them are brought to the reference potential $\phi_1$. The electrodes of the second series which immediately precede even electrode (52) are brought to a potential $\phi_2$. A pair of electrodes 51, 52 defines one cell (a) of register $A_0$. In order to simplify the diagram, register $A_0$ is only represented by its first series of electrodes within which the applied potential is noted. According to a conventional mechanism the electrical charges are transferred from one electrode to the other in a direction normal to the electrodes 51 and 52 in a channel of width L, bounded by an insulating barrier 53.

The corresponding digital—analog multiplication and summation element has three groups of M transistors ($T_B$, $T_L$ and $T_{RAZ}$), i.e. three transistors per cell of registers $A_0$ and $N_0$, connected to a transistor ($T_R$) of the MOS depletion type and a capacity (C) common to all the stages ($E_0$-$E_{p-1}$). Each of the M transistors $T_B$ of the MOS depletion type is respectively connected between potential V and one of the electrodes 52 of register $A_0$, each of the gates of MOS transistors $T_B$ respectively receiving signals $s_o$ from the coefficient register $N_0$. Each of the electrodes 52 is also connected to a point E common to one of the transistors $T_{RAZ}$ of the MOS enhancement type and to one of the transistors $T_L$, also of the MOS enhancement type. The gate of transistors $T_{RAZ}$ is connected to a potential $\phi_{RAZ}$ and the gate of transistors $T_L$ to a potential $\phi_2$. The other terminal (source) of MOS transistors $T_{RAZ}$ is connected to earth and the terminal (drain) of the MOS transistors $T_L$ to a point D, common to all the stages of the filter. Capacity C is connected between D and earth. Transistor $T_R$ of the MOS depletion type is connected between D and a potential $V_{DD}$ which is higher than V, the gate of said transistor being controlled by a potential $\phi_{11}$ in phase with $\phi_1$ and of the same shape, but whose amplitude $V_1$ is higher than that of $\phi_1$.

In practice if the potential V is close to 12 volts potential $V_{DD}$ can be of the order of 20 volts.

FIG. 8 shows signals $\phi_1$, $\phi_2$, $\phi_{RAZ}$ and $\phi_2$ which are applied to the device of FIG. 7.

Signal $\phi_1$ shown in diagram 8a is identical to that of diagram 4a. Signal $\phi_2$ is preferably identical to $\phi_1$, but is in phase opposition with the latter and is shown in diagram 8b. Signal $\phi_2$ shown in diagram 8c is of the same period T as the previous signals, but the high value duration (e.g. also equal to V) is significantly greater than T/2. In addition the descending front of $\phi_2$ is in phase with the descending front of $\phi_2$. Signal $\phi_{RAZ}$ shown in diagram 8d is the complement of signal $\phi_2$.

The operation of stage $E_0$ in FIG. 7 is as follows. When a signal $s_o$ is equal to zero the corresponding transistor $T_B$ is blocked and all the corresponding transistors $T_L$ and $T_{RAZ}$, $T_R$ and the capacity C function as a current reading device of a quantity of charges, said device being for example described in U.S. Pat. Application Ser. No. 902,046 in the name THOMSON-CSF, with particular reference to FIGS. 4 and 5 thereof and of which brief operating details are given hereinafter:

During the time $t_6$, $\phi_{11}=V_1$ and $\phi_{RAZ}=V$, i.e. transistors $T_R$ and $T_{RAZ}$ are conductive, whilst $\phi_2=0$ blocks transistor $T_L$. Therefore point D is raised to a potential substantially equal to $V_{DD}$, transistor $T_R$ being polarised in triode and capacity C charges. During the time $t_7$, $\phi_{11}$ is still equal to $V_1$, but $\phi_{RAZ}$ and $\phi_2$ are zero. Transistors $T_L$ and $T_R$ are conductive and simultaneously raise the potential of electrode 52 to the value $(V-V_T)$, the amplitude V of $\phi_2$ and the potential $V_{DD}$ being such that transistors $T_L$ function in saturation, $V_T$ being the threshold value of transistors $T_L$. During the time $t_8$, $\phi_{11}=0$ blocking transistor $T_R$ and insulating the capacity C from any external voltage supply. During this time $\phi_2=V$ and when a packet of charges $\Delta Q$ passes beneath electrode 52 it leads to the discharging of capacity C, causing a potential variation $\Delta Q/C$ at point D, constituting the output signal of the device. Thus, the summation of the contributions of all the electrodes 52 of the different stages takes place automatically at point D.

When a signal s received at the gate of a transistor $T_B$ differs from zero it is at level V, as has been shown hereinbefore (FIG. 4) and the corresponding electrode 52 is raised to potential V via the corresponding transistor $T_B$. This has the effect of blocking the corresponding transistor $T_L$, due to the fact that the potential applied to its source (point E) becomes equal to V, the value of the potential applied to its gate (when potential $\phi_2$ is at the high level). It is therefore impossible to read the quantity of charges beneath electrode 52 and point D undergoes no potential variation from said stage.

The function of transistor $T_{RAZ}$ is the zeroing of the potential at point E after the reading operation in order to discharge the charges to the following stage.

It should be noted that it is a bit "one" in the coefficient register which, according to FIG. 4 corresponds to a level e=zero volt and a signal s, which differs from zero which blocks the reading of the signal register. It is therefore necessary to complement the coefficient bits prior to their introduction into the different coefficient registers N.

Figure 9:
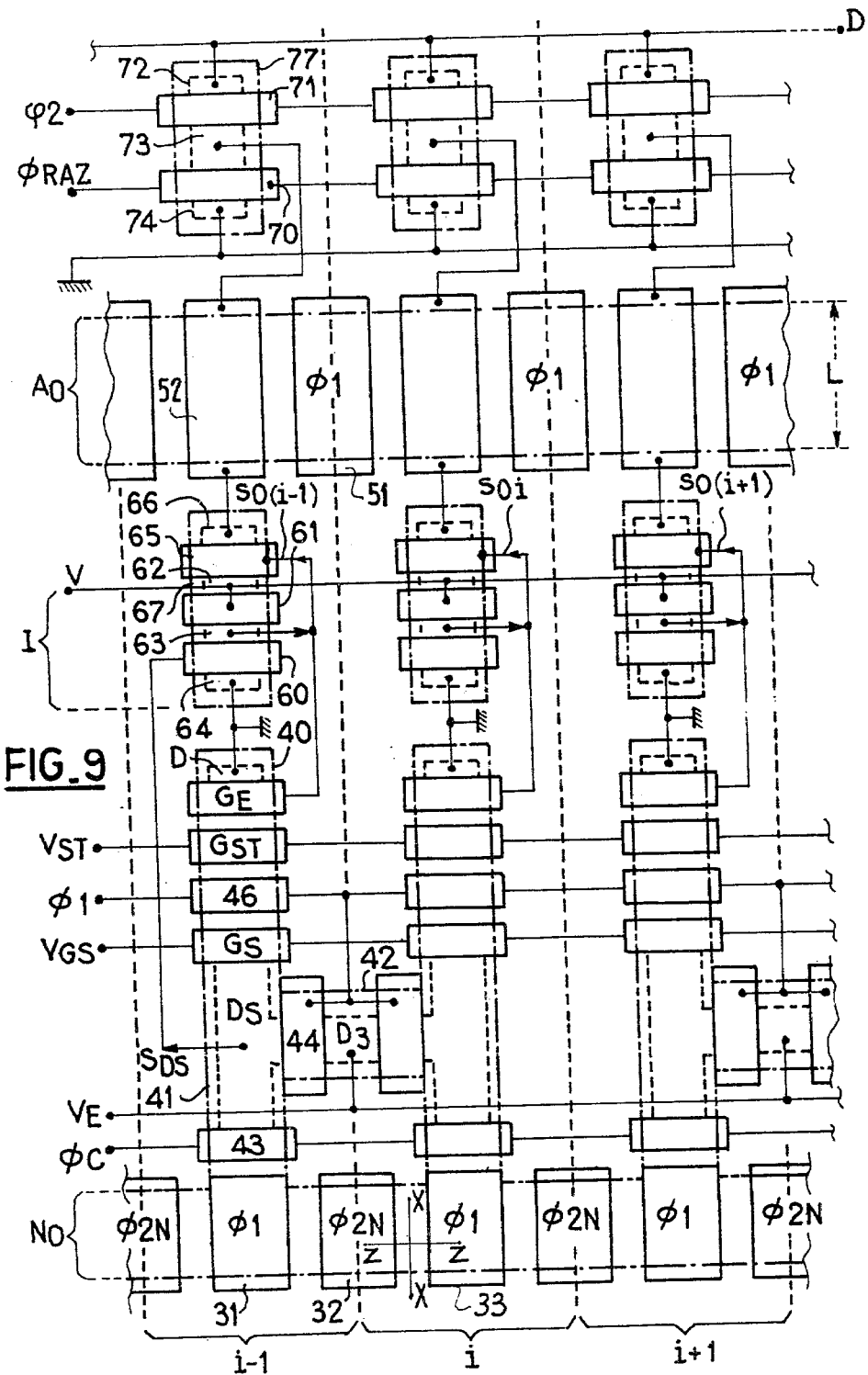
FIG. 9 a practical embodiment of a filter stage according to the invention.

FIG. 9 shows a practical embodiment of a filter stage according to the invention, for example the first stage $E_0$.

The coefficient register $N_0$ is represented by its electrodes 31 and 32, respectively raised to the potential $\phi_1$ and $\phi_{2N}$. Each pair of electrodes defines a cell (n) of said register and the drawings shows three of these cells, respectively $i-1$, i and $i+1$. In the same way as described in FIG. 5 a memory element is connected to each electrode 31, i.e. by means of channel 41 which starts with electrode 43 connected to potential $\phi_C$. As in FIG. 5 channel 40 is in the extension of channel 41 and channel 42 is parallel to register $N_0$. However, the present embodiment differs from that described hereinbefore by the fact that channel 42 has no electrode 45 and whose diode $D_3$ is common to two adjacent stages (in FIG. 9 channels $i-1$ and i) and inverter I on the same substrate as register $N_0$ and the memory elements in the extension of channel 40.

Inverter I has three zones 62, 63 and 64 in the substrate and of a conductivity type opposed to the latter between which are arranged on an insulating layer two parallel electrodes, respectively 61 and 60, which constitute the gates of transistors $T_1$ and $T_2$ of FIG. 3b. Zone 64 is connected to earth, zone 63 is the common point B of two transistors, the output (s) of the inverter and zone 62 is raised to potential V. In the extension of element 60 to 64 constituting the inverter I, is placed transistor $T_B$ described relative to FIG. 7. It is formed by zone 62, an electrode 65 placed behind zone 62 parallel to electrodes 60 and 61 receiving the signal $s_o$ of inverter I and a zone 66, identical to zones 62, 63 and 64, placed behind electrode 65. This group of zones and electrodes 60 and 66 is insulated from the remainder of the substrate by an insulating barrier 67.

Signal register $A_0$ is represented by its electrodes 51 and 52, as in FIG. 7. It is made in the same substrate as the previous elements. The electrodes 52 having to receive the signal from transistor $T_B$, i.e. each having to be connected to a zone 66, all the electrodes of register $A_0$ are positioned in such a way that each of the electrodes 52 is in the extension of an inverter I.

Two transistors $T_{RAZ}$ and $T_L$ of the digital-analog multiplication and summation element corresponding to the cell in question are placed in the extension of each electrode 52. They are constituted by three zones 72, 73 and 74 made in the substrate and of a conductivity type opposed to the latter between which are arranged on an insulating layer two parallel electrodes 71, 70 constituting the gates of transistors $T_L$ and $T_{RAZ}$ of FIG. 7. Zone 74 is connected to earth, whilst zone 73 is the common point E of the two transistors and zone 72 supplies the output signal of the cell directed to point D. The system of elements 70 and 74 is insulated from the remainder of the substrate by an insulating barrier 77.

Transistor $T_R$, capacity C and conventional means for sampling the signal at D are connected to said point D and can also be integrated on the same substrate.

This embodiment has the advantage that all the elements of the same cell are in the form of an extension of one another, making it possible to use shift registers N and A in which the distance between the areas of two consecutive electrodes 32 or 52 is small. It can for example be approximately 40 $\mu$m. As a further example if a width of about 40 $\mu$m is used for L a total width of approximately 300 to 350 $\mu$m is obtained for the first stage $E_0$ from register $N_0$ to zone 72.

In order to obtain the complete filter as illustrated in FIG. 2 for each of the filtering coefficients the number of stages, such as that of FIG. 9, is made to correspond to the number of bits (p). There are two possible solutions with regard to the sign of the coefficients. It is either possible to provide a supplementary stage ($E_p$), which is identical to the previous stages, but which contains the sign information of each of the M coefficients. This stage must then have a weight equal to the sum of the weights of the preceding stages ($E_0 \ldots E_{p-1}$), i.e. the width of the signal register ($A_p$) of this stage must have a width equal to $2^p L$. This stage is connected to a capacity (C') of the same value, but different from the capacity C common to the previous stages. The output signal of the filter is obtained by forming a difference, e.g. by means of a differential amplifier, between the signal supplied by the stage of sign ($E_p$) and the signal supplied by all the preceding stages ($E_0 \ldots E_{p-1}$). Alternatively it is impossible to provide two coefficient registers in each stage, one for each sign. This makes it possible to eliminate the stage of sign (Ep) of the previous solution, which is disadvantageous from the dimensional standpoint. The signal register of this stage is in fact of the same width as L multiplying a factor $2^p$.

In addition, numerous variants of the filter according to the invention are possible and these are covered by the scope of the present invention. Among these it is possible to refer to that relating to the weighting of the signals obtained relative to each stage ($E_0 \ldots E_{p-1}$). In the preceding description, the weighting is obtained by the width of the signal registers ($A_0 \ldots A_{p-1}$) and the stages $E_0$-$E_{p-1}$ are connected to a common capacity C. In a not shown variant, the weighting can be obtained by varying the value of the capacity. All the signal registers ($A_0 \ldots A_{p-1}$) then have the same width L, but each of the stages is connected to a separate capacity ($C_0 \ldots C_{p-1}$), whose values are as follows:

for stage $E_0$: $C_0$
for stage $E_1$: $C_1 = C_0/2$
for stage $E_2$: $C_2 = C_0/4$
for stage $E_{p-1}$: $C_{p-1} = C_0/2^{p-1}$ The signals supplied by the different stages are then summated in the conventional manner, e.g. by means of an operational amplifier. In this case the sign can be treated in the manner described hereinbefore. In particular it can be carried by a supplementary stage $E_p$, connected to a separate capacity $C_p = C_0/2^p$

What is claimed is:

1. A digitally programmable electrical charge transfer filter receiving an analog signal to be filtered and M filtering coefficients, each coefficient being digitally expressed on P bits, said filter comprising p separate stages, each of said stages comprising a first charge transfer shift register, called signal register, which comprises at least M transfer stages called cells, and which receives said analog signal; a second charge transfer shift register, called coefficient register, which comprises M transfer stages, called cells, which receives the M bits of the same weight of said M coefficients; and M memory elements, respectively connected to the output of said M cells of said coefficient register, thereby statically storing said M bits; said filter further comprising multiplication and summation means for the digital-analog multiplication of the data contained in said signal register and in said coefficient register relative to each stage and for the summation of the results of the multiplications in each stage, thus supplying the output signal of said filter.

2. A filter according to claim 1, wherein each of said coefficient registers comprises a semiconductor substrate, electrodes arranged on said substrate, defining said M cells, periodic potentials being applied to said electrodes for transferring electrical charges in said substrate.

3. A digitally programmable electrical charge transfer filter receiving an analog signal to be filtered and M filtering coefficients, each coefficient being digitally expressed on p bits, said filter comprising p separate stages, each of said stages comprising a charge transfer shift register, called signal register, which comprises at least M transfer stages called cells, and which receives said analog signal; a charge transfer shift register, called coefficent register, which comprises M transfer stages, called cells, and M memory elements, respectively connected to the output of said M cells, and which receives the M bits of the same weight of said M coefficients, said filter further comprising multiplication and summation means for the digital analog multiplication of the data contained in said signal register and in said coefficient register relative to each stage and for the summation of the results of the multiplications in each stage, thus supplying the output signal of said filter; wherein each of said coefficient registers comprises a semiconductor substrate, electrodes arranged on said substrate, defining said M cells, periodic potentials being applied to said electrodes for transfering electrical charges in said substrate; wherein each of said memory elements comprises a diode, called output diode, a first charge transfer channel connected to a cell of said coefficient register and receiving the signal to be stored, comprising an electrode to which is applied a sampling potential ensuring the sampling and application of said signal to be stored to said output diode, means for the inversion and regeneration of the signal supplied by said output diode, said inversion means supplying the output signal of said memory element, means for injecting packets of charges representing said output signal of the memory element into the substrate, a second charge transfer channel carrying electrodes to which are applied periodic potentials, called transfer potentials, such that said packets of charges are propagated in said second channel and returned to said output diode with a given delay with respect to their injection time and a third charge transfer channel having a diode to which is applied a first constant potential and an electrode to which is applied a periodic transfer potential such that said constant potential is applied to said output diode when the signal to be stored is not constant.

4. A filter according to claim 3, wherein said injection means comprise a diode and two electrodes, said diode being kept at the reference potential of said filter, whilst first of said two electrodes receives the output signal from the memory element and the second of said electrodes is raised to a second constant potential.

5. A filter according to claim 3, wherein said inversion and regeneration means comprise two MOS-type transistors connected in series between earth and a third constant potential, their common point supplying the output signal of the memory element, the gate of that of the transistors which is connected to the reference potential receiving said output signal of the output diode and the gate of the other transistor being connected to said third constant potential.

6. A filter according to claim 3, wherein said second channel comprises, downstream of the injection means, an electrode connected to a transfer potential.

7. A filter according to claim 1, wherein each of said signal registers comprises a semiconductor substrate, electrodes deposited on said substrate, controlled by periodic potentials, said electrodes defining M cells, the width of each of said signal registers being substantially of the form $2^k L$, in which $0 \leq k < p$, L being a given width and k the weight of the bits of the coefficients contained in the coefficient register of the $k^{th}$ stage of said filter.

8. A digitally programmable electrical charge transfer filter receiving an analog signal to be filtered and M filtering coefficients, each coefficient being digitally expressed on p bits, said filter comprising p separate stages, each of said stages comprising a charge transfer shift register, called signal register, which comprises at least M transfer stages called cells, and which receives said analog signal; a charge transfer shift register, called coefficient register, which comprises M transfer stages, called cells, and M memory elements, respectively connected to the output of said M cells, and which receives the M bits of the same weight of said M coefficients, said filter further comprising multiplication and summation means for the digital-analog multiplication of the data contained in said signal register and in said coefficient register relative to each stage and for the summation of the results of the multiplications in each stage, thus supplying the output signal of said filter; each of said signal registers comprises a semiconductor substrate, electrodes deposited on said substrate, controlled by periodic potentials, said electrodes defining M cells, the width of each of said signal registers being substantially of the form $2^k L$, in which $0 \leq k < p$, L being a given width and k the weight of the bits of the coefficients contained in the coefficient register of the $k^{th}$ stage of said filter; wherein said multiplication and summation means comprise a unit connected at a point common to said p filter stages, said unit comprising a capacity connected between said common point and the reference potential of said filter, and a transistor connected between the common point and an external continuous potential source, said transistor being controlled in phase with a first periodic transfer potential, said multiplication means further comprising, with respect to each of said p stages of said filter, three groups of M transistors controlled by said output signals of the M memory elements of the coefficient register, realizing with said unit the reading of the quantities of charges existing respectively beneath the M electrodes of said signal register which are preceded by transfer electrodes controlled by a second periodic transfer potential in phase opposition with said first transfer potential, said reading supplying said output signal of the filter.

9. A filter according to claim 8, wherein for each of said stages, each of the transistors of said first group is connected between a third constant potential and an electrode of said signal register which is preceded by a transfer electrode controlled by said second transfer potential, said transistors of first group receiving on their gate an output signal from one of said memory element.

10. A filter according to claim 8, wherein for each of said stage, each of the transistors of said second group has a common point with one transistor of said third group, the latter being connected between said common point and the reference potential of said filter and receiving on its gate a periodic potential ensuring the zeroing of the common point, the transistors of said second group being in each case connected between the two common points and receiving on their gate a periodic potential which is a complement of the first mentioned periodic potential in such a way that said transistors of the second group function in saturation.

11. A filter according to claim 8, wherein each of said memory elements comprises a diode, called output diode, a first charge transfer channel connected to a cell of said coefficient register and receiving the signal to be stored, comprising an electrode to which is applied a sampling potential ensuring the sampling and application of said signal to be stored to said output diode, means for the inversion and regeneration of the signal supplied by said output diode, said inversion means supplying the output signal of said memory element, means for injecting packets of charges representing said output signal of the memory element into the substrate, a second charge transfer channel carrying electrodes to which are applied periodic potentials, called transfer potentials, such that said packets of charges are propagated in said second channel and returned to said output diode with a given delay with respect to their injection time and a third charge transfer channel having a diode to which is applied a first constant potential and an electrode to which is applied a periodic transfer potential such that said constant potential is applied to said output diode when the signal to be stored is not constant, and wherein for each stage of said filter, the first and second channels of each of said memory elements are placed perpendicular to the charge transfer direction in the coefficient register of the same stage, the third channel is placed parallel to said same direction, the adjacent memory elements, taken in pairs, having in common the diode of the third channel, inversion and regeneration means are provided on the same substrate as said coefficient register and are placed in the extension of the second channel, the corresponding transistor of the first group is placed in the extension of the inversion means, the signal register is made on the same substrate as the coefficient register and is placed in the vicinity of the transistors of the first group in such a way that the charge transfer direction into the signal register is the same as into the coefficient register and the corresponding transistors of the second and thirds groups are made on the same substrate and placed in the extension of the inversion means in the vicinity of the signal register.

12. A filter according to claim 8, wherein said injection means comprises a diode and two electrodes, said diode being kept at the reference potential of said filter, whilst first of said two electrodes receives the output signal from the memory element and the second of said electrodes is raised to a second constant potential and further comprising a further stage representing the sign of M coefficients, having a signal register of width $2^p L$ and a coefficient register, the multiplication and summation means further comprising a second capacity of the same value as the first and connected to the output point of said supplementary stage and three groups of M transistors, the output signal of the filter being constituted by the difference between the signal supplied by said supplementary stage and the signal supplied by the p other stages.

13. A filter according to claim 1, wherein each of said signal registers comprises a semiconductor substrate, electrodes deposited on said substrate, controlled by periodic potentials for transfering electrical charges, said electrodes defining M cells, the width of said signal registers being the same for all the stages of said filter.

14. A digitally programmable electrical charge transfer filter receiving an analog signal to be filtered and M filtering coefficients, each coefficient being digitally expressed on p bits, said filter comprising p separate stages, each of said stages comprising a charge transfer shift register, called signal register, which comprises at least M transfer stages called cells, and which receives said analog signal; a charge transfer shift register, called coefficient register, which comprises M transfer stages, called cells, and M memory elements, respectively connected to the output of said M cells, and which receives the M bits of the same weight of said M coefficients, said filter further comprising multiplication and summation means for the digital-analog multiplication of the data contained in said signal register and in said coefficient register relative to each stage and for the summation of the results of the multiplications in each stage, thus supplying the output signal of said filter; each of said signal registers comprises a semiconductor substrate, electrodes deposited on said substrate, controlled by periodic potentials for transfering electrical charges, said electrodes defining M cells, the width of said signal registers being the same for all the stages of said filter; wherein the multiplication and summation means comprise for each stage of said filter a capacity ($C_0 \ldots C_{p-1}$), whose value is of the form $C_0/2^k$, with $0 \leq k < p$, k being the weight of the coefficient bits contained in the Kth coefficient register, three groups of M transistors realising under the control of the output signals of said M memory elements and in combination with the preceding capacity the reading of the quantities of charges existing respectively under the M electrodes of the signal register which are preceded by transfer electrodes controlled by a second periodic transfer potential in phase opposition with the first transfer potential, the signals available at the terminals of said p capacities ($C_0 \ldots C_{p-1}$) being summated to supply said output signal of the filter.

15. A filter according to claim 14, further comprising a supplementary stage representing the sign of the M coefficients, said supplementary stage comprising a signal register of the same width as the p other signal registers and a coefficient register, said multiplication and summation means further comprising a capacity of value $C_0/2^p$ and three groups of M transistors, the output signal of the filter being constituted by the difference between the signal supplied by said supplementary stage and the signal supplied by the p other stages.

* * * * *